(12) United States Patent
Park et al.

(10) Patent No.: US 6,784,612 B2
(45) Date of Patent: Aug. 31, 2004

(54) ORGANIC EL DISPLAY DEVICE AND METHOD OF ENCAPSULATING THE SAME

(75) Inventors: Jin-Woo Park, Suwon (KR); Seung-Yong Song, Suwon (KR); Hun Kim, Suwon (KR)

(73) Assignee: Samsung SDI Co., Ltd., Suwon-si (KR)

( * ) Notice: Subject to any disclaimer, the term of this patent is extended or adjusted under 35 U.S.C. 154(b) by 0 days.

(21) Appl. No.: 10/067,818

(22) Filed: Feb. 8, 2002

(65) Prior Publication Data

US 2003/0020401 A1 Jan. 30, 2003

(30) Foreign Application Priority Data

Jul. 30, 2001 (KR) .......................... 2001-46018

(51) Int. Cl.$^7$ ................................ H01J 1/62
(52) U.S. Cl. .................. 313/512; 313/504; 445/25
(58) Field of Search ................. 313/512, 504, 313/498–503, 505–511; 445/24, 25; 220/2.1 R, 2.2, 2.3 R; 174/50.5, 50.51, 50.58, 50.61, 50.54, 50.62, 17 E, 17 GF, 17.05, 17.06

(56) References Cited

U.S. PATENT DOCUMENTS

| | | | | |
|---|---|---|---|---|
| 3,926,502 A | * | 12/1975 | Tanaka et al. ............ 349/154 |
| 4,357,557 A | * | 11/1982 | Inohara et al. ............ 313/509 |
| 4,770,310 A | * | 9/1988 | Morimoto et al. ........... 220/2.2 |
| 4,810,931 A | * | 3/1989 | McKenna et al. .......... 313/509 |
| 4,839,557 A | * | 6/1989 | Schrank ................ 313/509 |
| 5,059,148 A | * | 10/1991 | McKenna et al. ........... 445/25 |
| 5,239,228 A | * | 8/1993 | Taniguchi et al. .......... 313/512 |
| 5,990,615 A | * | 11/1999 | Sakaguchi et al. ......... 313/504 |
| 6,023,073 A | * | 2/2000 | Strite .................. 257/40 |
| 6,057,647 A | * | 5/2000 | Kurosawa et al. ....... 315/169.3 |
| 6,172,458 B1 | * | 1/2001 | Nakaya et al. ........... 313/504 |

* cited by examiner

*Primary Examiner*—Ashok Patel
*Assistant Examiner*—German Colón
(74) *Attorney, Agent, or Firm*—Staas & Halsey LLP

(57) ABSTRACT

An organic electroluminescent (EL) display device includes an organic EL element formed on a substrate. The organic EL element includes a lower electrode, an organic EL layer and an upper electrode that are sequentially stacked on the substrate. A flat panel is attached to the substrate to encapsulate the organic EL element. At least one through hole is formed in the organic EL display device so as to allow gas inside the organic EL display device to flow out during an encapsulation process. A cap is provided to shut the one or more through holes.

19 Claims, 6 Drawing Sheets

ORGANIC EL DISPLAY DEVICE AND METHOD OF ENCAPSULATING THE SAME

CROSS REFERENCE TO RELATED APPLICATIONS

This application claims the benefit of Korean Patent Application No. 2001-46018, filed on Jul. 30, 2001, in the Korean Industrial Property office, the disclosure of which is incorporated herein by reference.

BACKGROUND OF THE INVENTION

1. Field of the Invention

The present invention relates to a flat panel display device, and more particularly, to an organic electroluminescent (EL) display device and a method of encapsulating the same.

2. Description of Related Art

Examples of a flat panel display device include a liquid crystal display (LCD) device, an organic EL display (OELD) device, a field emitter display (FED) device, and a plasma display panel (PDP). Of these, the organic EL display device attracts attention due to a wide viewing angle, a clearer moving picture, a high durability, and a high temperature resistance.

FIG. 1 is a cross-sectional view illustrating a conventional organic EL display device. The organic EL display device includes a lower electrode 12, an organic EL layer 14, and an upper electrode 16 which are sequentially stacked on a transparent insulating substrate ("insulating substrate") 10.

A structure that emits light from the organic EL layer 14 toward the insulating substrate 10 is referred to as a back surface light emitting structure, and a structure that emits light from the organic EL layer 14 toward a direction opposite to the insulating substrate 10 is referred to as a front surface light emitting structure.

In case of the back surface light emitting structure, the lower electrode 12 is made of a transparent conductive material, and the upper electrode 16 is made of an opaque conductive material. On the other hands, in case of the front surface light emitting structure, the lower electrode 12 is made of an opaque conductive material, and the upper electrode 16 is made of a transparent conductive material.

Hereinafter, the organic EL display device is described focusing on the back surface light emitting structure.

The lower electrode 12 is made of a transparent conductive material including one of indium tin oxide (ITO) and indium zinc oxide (IZO), and the upper electrode 16 is made of an opaque conductive material including one of magnesium, aluminum, indium, and silver-magnesium.

A passivation layer (not shown) can be formed over the entire surface of the insulating substrate 10 to cover an organic EL element 18.

A metal cap 20 is attached to the insulating substrate 10 using an adhesive 22 to encapsulate the organic EL element 18 so as to protect the organic EL display from oxygen or moisture. The metal cap 20 is made of an aluminum alloy. A moisture/water absorbing layer 24 is arranged on an inner surface of the metal cap 20 to prevent element characteristics (e.g., a light-emitting efficiency) from being deteriorated due to the moisture or water.

FIG. 2 shows a flow chart illustrating a process of encapsulating the organic EL display device of FIG. 1. The lower electrode 12, the organic EL layer 14, and the upper electrode 16 are sequentially formed on the insulating substrate 10 (operation 202). The adhesive 22 is coated on a periphery region of the insulating substrate 10 to a thickness of about 150 μm (operation 204). The metal cap 20 is rested on the adhesive 22 and pressurized to attach the metal cap 20 to the insulating substrate 10 (operation 206). The adhesive 20 is cured at a predetermined temperature using a UV light (operation 208). Accordingly, encapsulation of the organic EL element 18 is completed.

However, the conventional encapsulating method has at least the following problems. As the adhesive 22 is pressurized by the metal cap 20, the thickness of the adhesive 22 is reduced to ~50 μm. Therefore, an inner pressure of a space formed by the insulating substrate 10 and the metal cap 20 is increased. Also, as the adhesive 22 is cured using a UV light, a gas volume of the space causes a thermal expansion. As a result, the adhesive 22 can be separated from the insulating substrate 10 and can have a non-uniform width. Accordingly, moisture can leak into the space, thereby deteriorating element characteristics of the organic EL display device.

In addition, the conventional organic EL display having the structure described above cannot satisfy a current trend toward a compact display device.

SUMMARY OF THE INVENTION

Accordingly, it is an object of the present invention provide an organic EL display device having improved element characteristics.

It is another object of the present invention to provide an organic EL display device having a compact structure.

Additional objects and advantages of the invention will be set forth in part in the description which follows and, in part, will be obvious from the description, or may be learned by practice of the invention.

To achieve the above and other objects of the present invention, there is provided an organic electroluminescent (EL) display device, comprising a substrate, an organic EL element having a lower electrode, an organic EL layer and an upper electrode sequentially stacked on the substrate, a flat panel which encapsulates the organic EL element and is attached to the substrate, at least one through hole formed in the substrate and/or the flat panel, and a through hole shutting cap which shuts the through hole.

To achieve the above and other objects of the present invention, there is also provided a method of encapsulating an organic EL display device, comprising providing at least one through hole in a substrate and/or a flat panel, forming an organic EL element including a lower electrode, an organic EL layer and an upper electrode that are sequentially stacked on the substrate, coating an adhesive on the substrate and/or the flat panel, attaching the substrate and the flat panel to each other, curing the adhesive at a predetermined temperature, and shutting the through hole.

BRIEF DESCRIPTION OF THE DRAWINGS

These and other objects and advantages of the invention will become apparent and more appreciated from the following description of the preferred embodiments, taken in conjunction with the accompanying drawings of which.

DETAILED DESCRIPTION OF PREFERRED EMBODIMENTS

Figure 1:
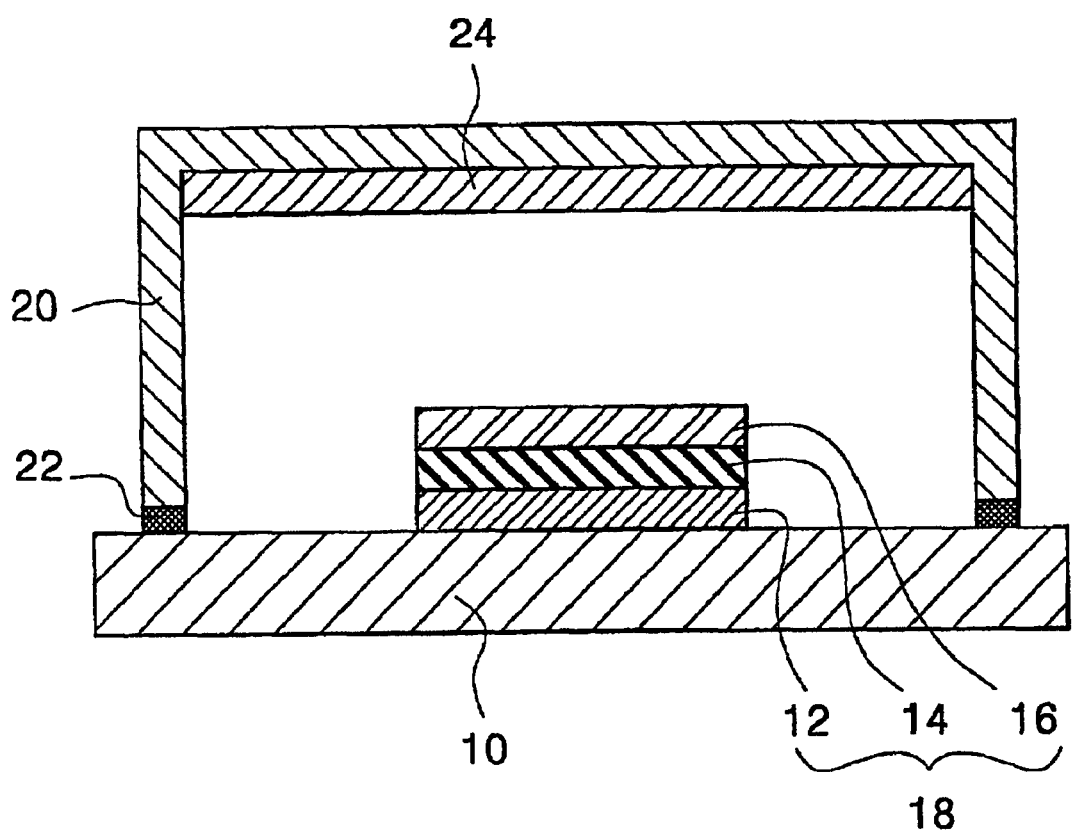
FIG. 1 is a cross-sectional view illustrating a conventional organic EL display device.
Figure 2:
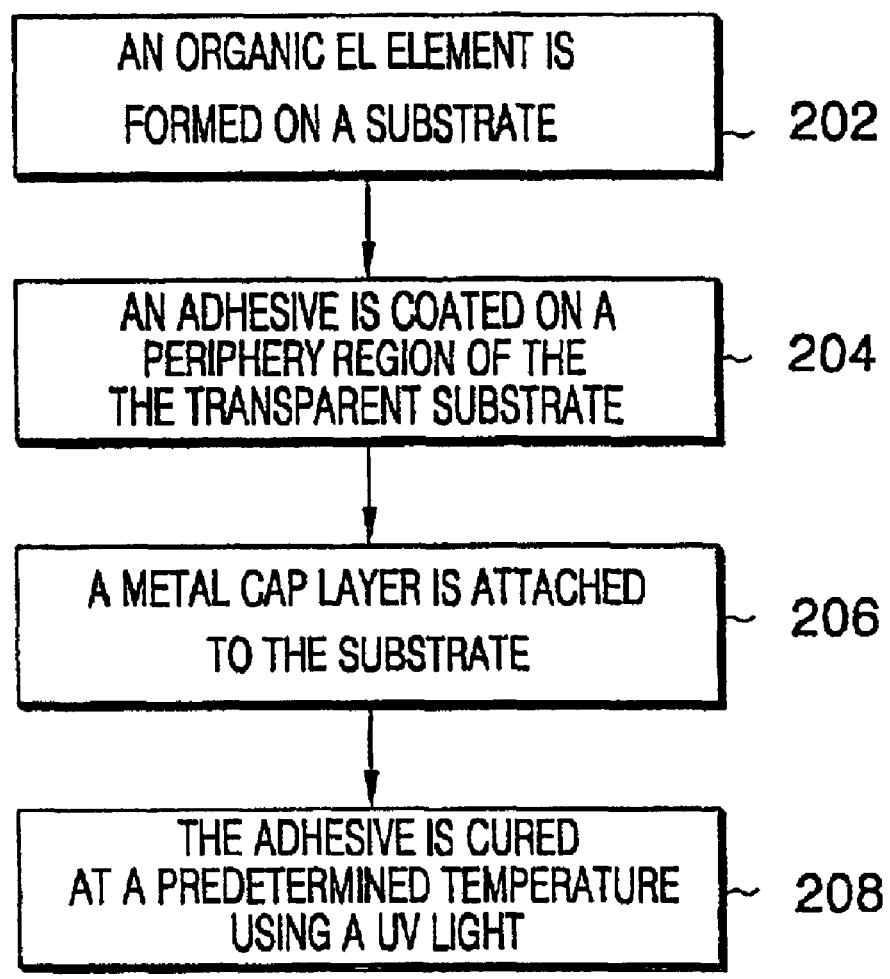
FIG. 2 is a flow chart illustrating a process of encapsulating the organic EL display device of FIG. 1.

Reference will now be made in detail to the present preferred embodiments of the present invention, examples of which are illustrated in the accompanying drawings, wherein like reference numerals refers to the like elements throughout. The embodiments are described below in order to explain the present invention by referring to the figures.

The organic EL display device according to the present invention can be applied to both a back surface light emitting structure and a front surface light emitting structure. Also, the present invention can be applied to both an active matrix (AM) organic EL display and a passive matrix (PM) organic EL display. However, for the sake of continuity, the present invention will be described in relation to a PM organic EL display device having a back surface light emitting structure.

Figure 3:
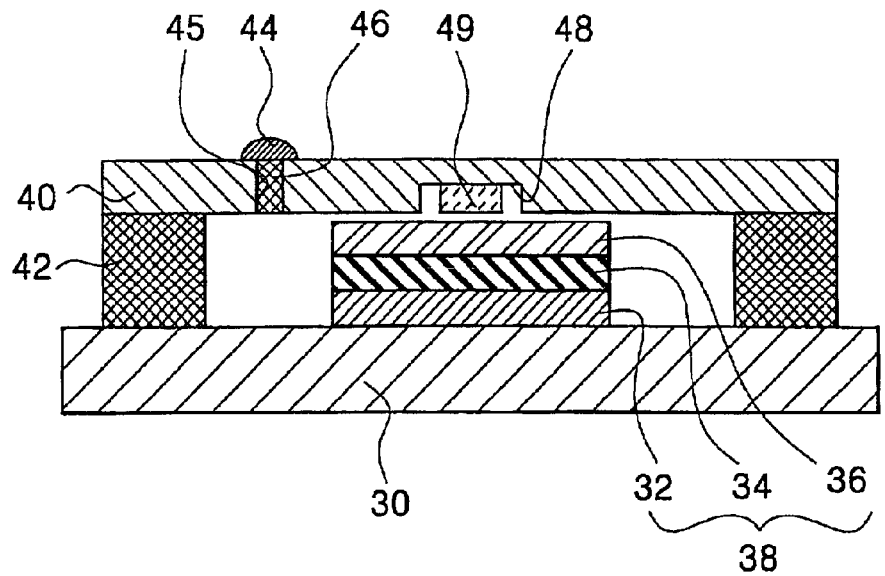
FIG. 3 is a cross-sectional view illustrating an organic EL display device according to an embodiment of the present invention.

FIG. 3 shows an organic EL display device according to an embodiment of the present invention.

An organic EL element 38 is formed on a transparent insulating substrate ("insulating substrate") 30. The insulating substrate 30 comprises a transparent insulating material such as a glass. The organic EL element 38 includes a lower electrode 32, an organic EL layer 34 and an upper electrode 36 which are sequentially stacked on the insulating substrate 30. The lower electrode 32 comprises one of indium tin oxide (ITO) and indium zinc oxide (IZO). The upper electrode 36 comprises one of magnesium, aluminum, indium, and silver-magnesium.

A passivation layer (not shown) can be formed to cover the organic EL element 38.

A flat panel 40 is attached to the insulating substrate 30 using an adhesive 42 to encapsulate the organic EL element 38. Encapsulation protects the organic EL element 38 from being deteriorated by moisture or water. The adhesive 42 can include spacers.

The flat panel 40 comprises one of an opaque material and a transparent material. To attach the flat panel 40 to the insulating substrate 30, the adhesive 42 is coated on the insulating substrate 30 and/or the flat panel 42. Then, the insulating substrate 30 and the flat panel 42 are aligned to each other, pressurized and cured using a UV light.

The flat panel 40 includes at least one through hole 45. As the insulating substrate 30 and the flat panel 40 are pressurized, gas in a space formed by the insulating substrate 30 and the flat panel 40 flows out through the through hole 45, so as to keep an inner pressure of the space constant. In addition, as the adhesive 42 is cured by the UV light, gas in the space also flows out through the through hole 45, so as to prevent separation of the adhesive 42 from the insulating substrate 30 and a non-uniform width of the adhesive 42.

The through hole 45 is filled with a curable agent 46. In addition, an upper surface of the curable agent 46 may be shut tightly by a welding 44 using one of indium (In) and lead (Pb).

The flat panel 40 may further include a moisture/water absorbing agent reception groove 48 on a bottom surface thereof. The moisture/water absorbing agent reception groove 48 receives a moisture/water absorbing agent 49 which removes moisture or water from the space formed by the insulating substrate 30 and the flat panel 40. The moisture/water absorbing agent reception groove 48 also allows the distance between the insulating substrate 30 and the flat panel 40 to be reduced by a distance corresponding to the thickness of the moisture/water absorbing agent 49. The moisture/water absorbing agent reception groove 48 is arranged at a location that does not shield light emitted from the organic EL element 38. For example, in case of the front surface light emitting structure, since light emitted from the organic EL element 38 is directed toward the flat panel 40, the moisture/water absorbing agent reception groove 48 can be arranged on the insulating substrate 30 and/or a portion of the flat panel 40 that does not correspond to the organic EL element 38. In FIG. 3, in case of the back surface light emitting structure, the moisture/water absorbing agent reception groove 48 may be situated on the bottom surface of the flat panel 40.

Figure 4:
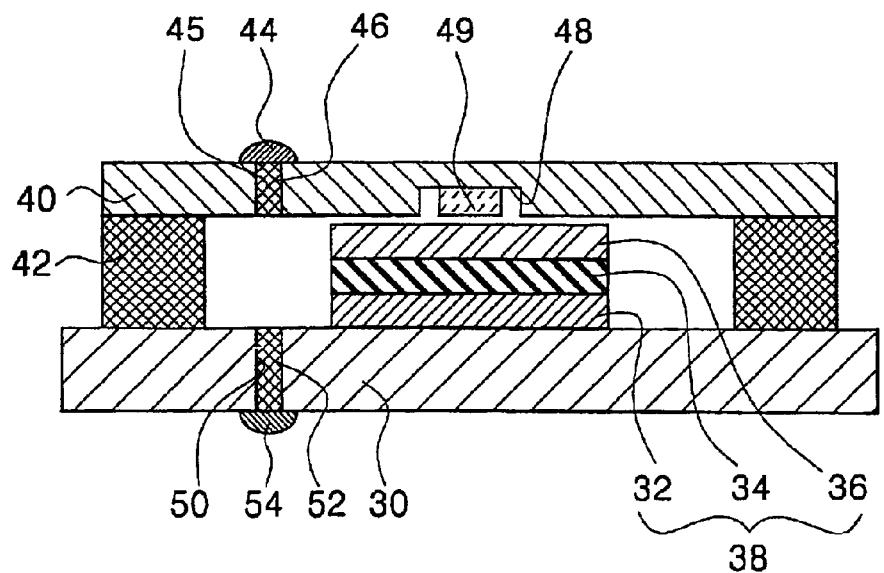
FIGS. 4 through 8 are cross-sectional views illustrating devices according to various aspects of the present invention.

The organic EL display device of FIG. 3 can have various modifications. According to an aspect of the present invention, FIG. 4 shows an organic EL display device having a second through hole 50 that is formed in the substrate 30 in addition to the through hole 45 formed in the flat panel 40. The second through hole 50 is also filled with a curable agent 52, and an upper surface of the curable agent 52 may be shut tightly by a welding 54 using one of indium (In) and lead (Pb).

Figure 5:
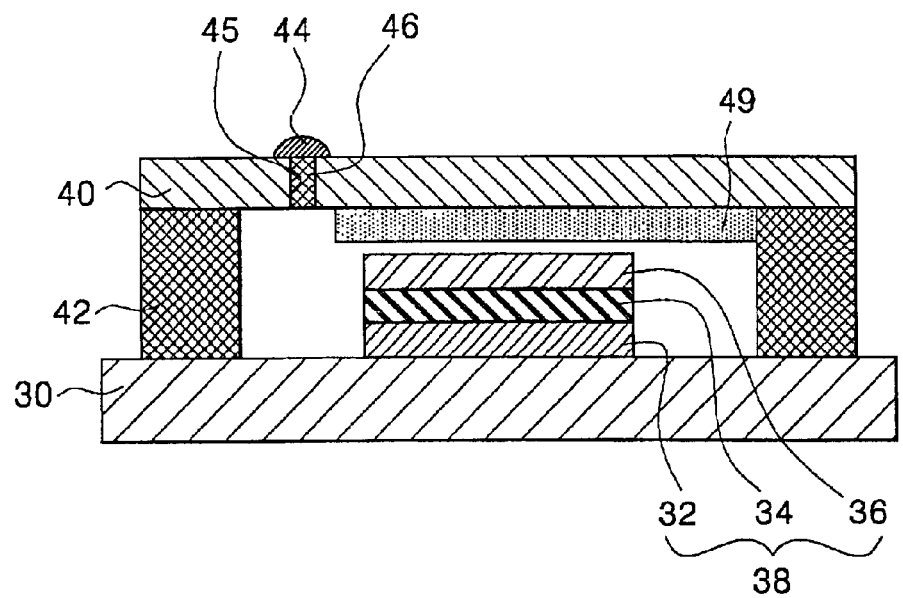

According to another aspect of the present invention, FIG. 5 shows an organic EL display device having the through hole 45 and a moisture/water absorbing agent 49 that is attached directly to a bottom surface of the flat panel 40 using an adhesive (not shown), and without the moisture/water absorbing agent groove 48 of FIG. 3.

Figure 6:
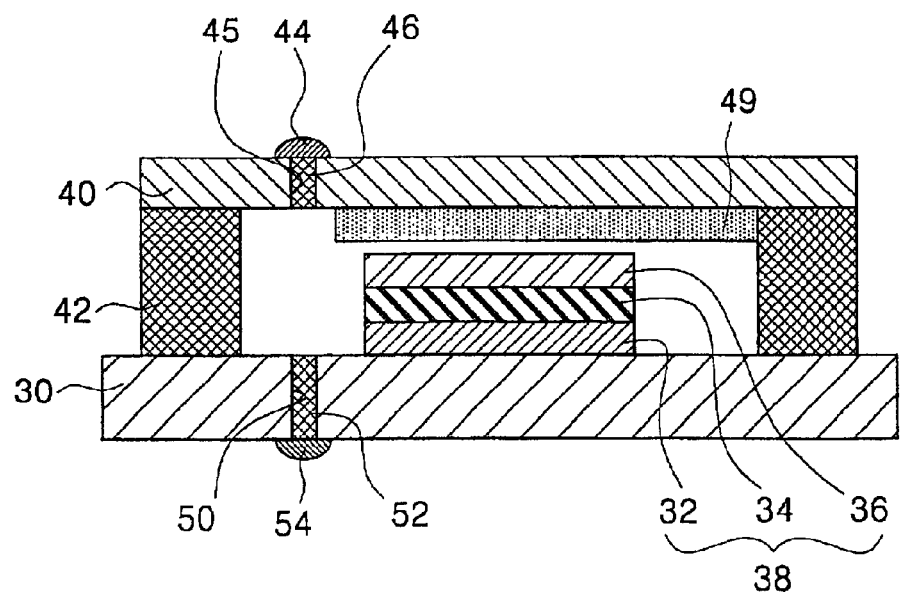

According to yet another aspect of the present invention, FIG. 6 shows an organic EL display device having both the through hole 45 in the flat panel 40 and the second through hole 50 formed in the substrate 30, and a moisture/water absorbing agent 49 that is attached directly to a bottom surface of the flat panel 40. The second through hole 50 is also filled with a curable agent 52, and an upper surface of the curable agent 52 may be shut tightly by a welding 54 using one of indium (In) and lead (Pb).

Figure 7:
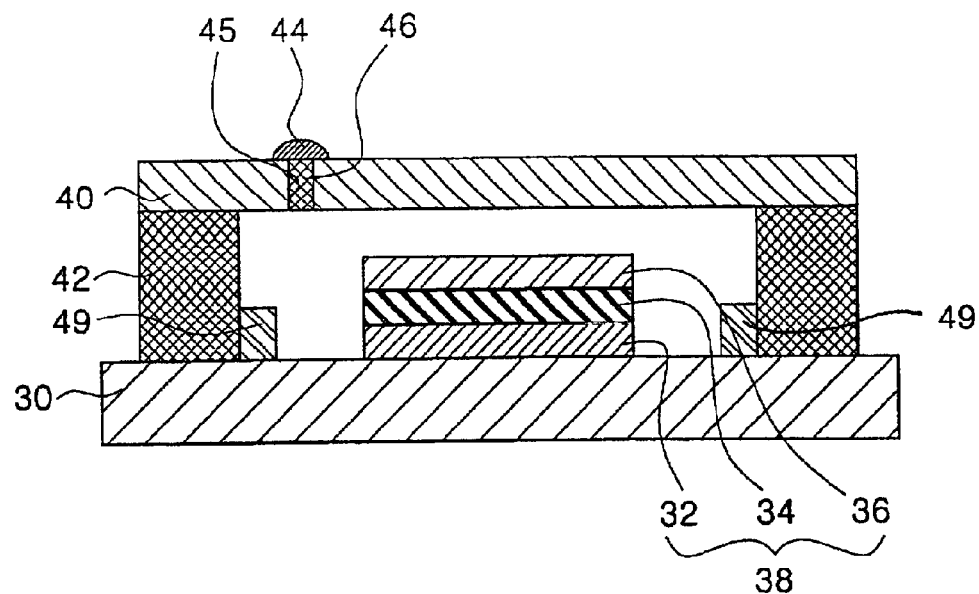

According to still another aspect of the present invention, FIG. 7 shows an organic EL display device having the through hole 45 and a moisture/water absorbing agent 49 that are arranged along a periphery region of the insulating substrate 30 or the flat panel 40 without the moisture/water absorbing agent reception groove 48 of FIG. 3.

Figure 8:
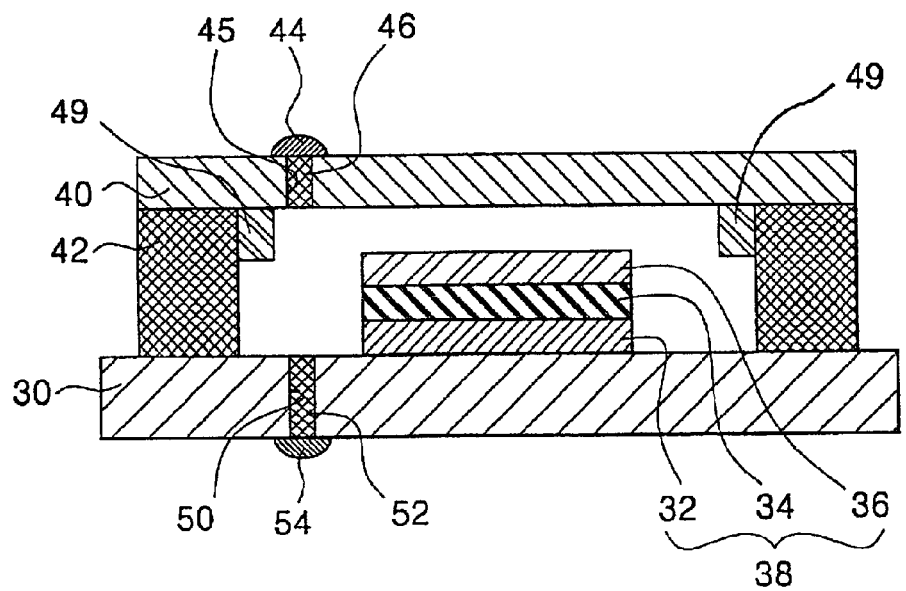

According to an additional aspect of the present invention, FIG. 8 shows an organic EL display device having a second through hole 50 that is formed in the insulating substrate 30 in addition to the through hole 45 formed in the flat panel 40 and moisture/water absorbing agents 49 that are arranged along a periphery region of the flat panel 40 or the insulating substrate 30. The second through hole 50 is also filled with a curable agent 52, and an upper surface of the curable agent 52 may be shut tightly by a welding 54 using one of indium (In) and lead (Pb).

In FIGS. 7 and 8, the moisture/water absorbing agent 49 can be arranged on a portion of the insulating substrate 30 and/or a portion of the flat panel 40 that does not shield light emitted from the organic EL element. In addition, it is understood that while one through hole has been shown to be formed in the insulating substrate 30 and/or the flat panel 40, additional through holes can be formed in the insulating substrate 30 and the flat panel 40 as needed.

Figure 9:
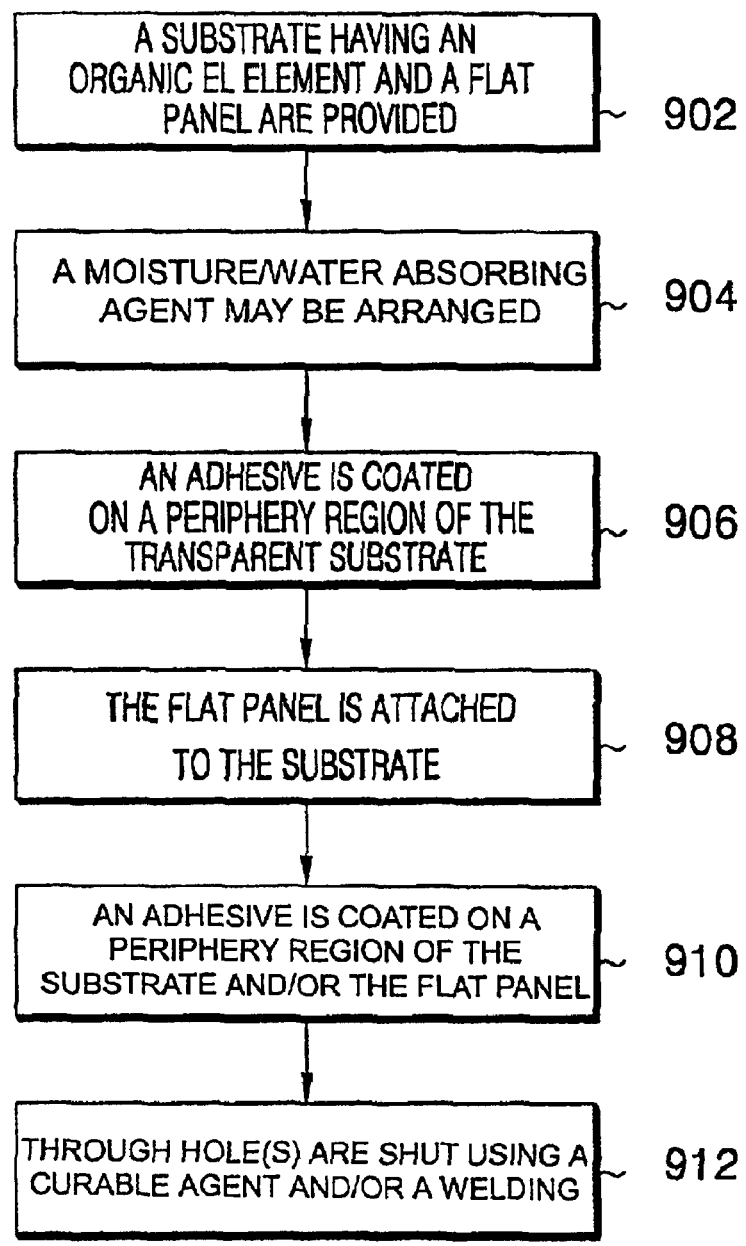
FIG. 9 is a flow chart illustrating a process of encapsulating the organic EL display devices of FIGS. 3 through 8.

FIG. 9 shows a flow chart illustrating a process of encapsulating the organic EL display device according to the present invention.

The lower electrode 32, the organic EL layer 34 and the upper electrode 36 are sequentially formed on the insulating substrate 30 (operation 902). The moisture/water absorbing agent(s) 49 may be arranged at a predetermined location (operation 904). The adhesive 42 is coated on a periphery region of the insulating substrate 30 and/or the flat panel 40 (operation 906). The substrate 30 and the flat panel 40 are aligned to each other and pressurized to attach to each other (operation 908). Even though a thickness of the adhesive 42 is reduced, gas in the space formed by the insulating substrate 30 and the flat panel 40 flows out through the one or more through holes 45 and 50. Therefore, an inner pressure of the space is not increased. Accordingly, separation of the adhesive 42 from the insulating substrate 30 and a non-uniform width of the adhesive 42 can be prevented.

The adhesive 42 is cured at a predetermined temperature using a UV light (operation 910). During the curing process, a gas volume of the space causes a thermal expansion. However, since the gas in the space can flow out through the one or more through holes 45 and 50, the adhesive 42 is not separated from the insulating substrate 30 and does not have a non-uniform width. Encapsulation of the organic EL display device is completed as the one or more through holes 45 and 50 are shut tightly by the curable agents 46 and 52 and/or the weldings 44 and 54 (operation 912).

As described herein before, the organic EL display device according to the present invention has at least the following advantages.

Although a thickness of the adhesive 42 is reduced during a pressurization process, an inner pressure of the space is not increased because gas in the space, which is formed by the insulating substrate 30 and the flat panel 40, is allowed to flow out through the one or more through holes 45 and 50. Accordingly, separation of the adhesive 42 from the insulating substrate 30 and a non-uniform width of the adhesive 42 can be prevented. Also, even though a gas volume of the space causes a thermal expansion as the adhesive 22 is cured, the gas in the space flows out through the one or more through holes 45 and 50. Again, the adhesive 22 is not separated from the insulating substrate 30 and does not have a non-uniform width. As a result, moisture or water cannot leak into the space, thereby improving element characteristics of the organic EL display device.

In addition, encapsulating the organic EL display device with the flat panel 40 produces a compact organic EL display device. The flat panel 40 can be attached closer to the insulating substrate 30 because the one or more through holes 45 and 50 regulates the pressure inside the space prior to the completion of the encapsulation process. That is, as the flat panel 40 is attached closer to the substrate 30, the one or more through holes 45 and 50 can also relieve the pressure that might otherwise increase as the unit area of the space is reduced.

Although a few preferred embodiments of the present invention have been shown and described, it would be appreciated by those skilled in the art that changes may be made in these embodiments without departing from the principles and spirit of the invention, the scope of which is defined in the claims and their equivalents.

What is claimed is:

1. An organic electroluminescent (EL) display device comprising:
    a substrate;
    an organic EL element formed on said substrate, wherein said organic EL element comprises a lower electrode, an organic EL layer and an upper electrode that are sequentially stacked on said substrate;
    a flat panel which encapsulates said organic EL element and is attached to said substrate, wherein gas fills a space formed by the substrate and the flat panel:
    at least one through hole formed in said flat panel; and
    a through hole shutting cap which shuts said through hole.

2. The device of claim 1, wherein said through hole shutting cap comprises a curable agent.

3. The device of claim 1, wherein said through hole shutting cap comprises a welding material.

4. The device of claim 3, wherein the welding material includes one of indium (In) and lead (Pb).

5. The device of claim 1, wherein said through hole is a passage which controls a pressure inside a space formed by said substrate and said flat panel prior to incorporation of said through hole shutting cap.

6. The device of claim 1, further comprising a moisture/water absorbing agent arranged at a location inside space formed by said substrate and said flat panel so as to not shield light emitted from said organ EL element, wherein said moisture/water absorbing agent removes moisture/water from the space.

7. The device of claim 6, wherein said flat panel includes a moisture/water absorbing agent reception groove which receives said moisture/water absorbing agent.

8. The device of claim 6, wherein the location is a periphery region of said substrate so as to not shield the light emitted from said organic EL element.

9. The device of claim 6, wherein the location is a periphery region of said flat panel so as to not shield the light emitted from said organic EL element.

10. The device of claim 1, further comprising an adhesive which attaches said flat panel to said substrate.

11. The device of claim 10, wherein said through hole is a passage which regulates pressure inside the organic EL display device prior to sealing of said through hole shutting cap to said through hole, and prevents non-uniform width and separation of said adhesive from said substrate.

12. An organic electroluminescent (EL) display device comprising:
    a substrate;
    an organic EL element formed on said substrate, wherein said organic EL element comprises a lower electrode, an organic EL layer and an upper electrode that are sequentially stacked on said substrate;
    a flat panel which encapsulates said organic EL element and is attached to said substrate;
    at least one through hole form in said flat panel; and
    a through hole shutting cap which shuts said through hole.
    wherein said through hole comprises;
    a first through hole formed in said flat panel; and
    a second through hole formed in said substrate.

13. An organic electroluminescent (EL) display device comprising:
    a substrate;
    an organic EL element formed on said substrate, wherein said organic EL element comprises a lower electrode, an organic EL layer and an upper electrode that are sequentially stacked on said substrate;
    a flat panel which encapsulates said organic EL element and is attached to said substrate;
    at least one through hole formed in said substrate; and
    a through hole shutting cap which shuts said through hole, wherein said through hole comprises:
  a first through hole formed in said substrate; and
  a second through hole formed in said flat panel.

14. An organic electroluminescent (EL) display device comprising:
  a substrate;
  an organic EL element formed on said substrate, wherein said organic EL element comprises a lower electrode, an organic EL layer and an upper electrode that are sequentially stacked on said substrate;
  a flat panel which encapsulates said organic EL element and is attached to said substrate, wherein gas fills a space formed by the substrate and the flat panel;
  at least one through hole formed in said substrate; and
  a through hole shutting cap which shuts said through hole.

15. The device of claim 14, wherein said through hole is a passage which controls a pressure inside a space formed by said substrate and said flat panel prior to incorporation of said through hole shutting cap.

16. the device of claim 14, further comprising an adhesive which attaches said flat panel to said substrate.

17. The device of claim 14, further comprising a moisture/water absorbing agent arranged at a location inside a space formed by said substrate and said flat panel so as to not shield light emitted from said organic EL element, wherein said moisture/water absorbing agent removes moisture/water from the space.

18. The device of claim 17, wherein said flat panel includes a moisture/water absorbing agent reception groove which receives said moisture/water absorbing agent.

19. The device of claim 17, wherein the location is a periphery region of said substrate or said flat panel so as to not shield the light emitted from said organic EL element.

* * * * *

UNITED STATES PATENT AND TRADEMARK OFFICE
CERTIFICATE OF CORRECTION

PATENT NO. : 6,784,612 B2
DATED : August 31, 2004
INVENTOR(S) : Jin-Woo Park et al.

It is certified that error appears in the above-identified patent and that said Letters Patent is hereby corrected as shown below:

Column 6,
Line 17, insert -- a -- after "inside";
Line 19, change "organ" to -- organic --;
Line 47, change "form" to -- formed --;
Line 48, change "." to -- , --;
Line 49, change ";" to -- : --.

Signed and Sealed this

Third Day of May, 2005

JON W. DUDAS
*Director of the United States Patent and Trademark Office*